(12) United States Patent
Wischnewskiy et al.

(10) Patent No.: US 10,897,214 B2
(45) Date of Patent: Jan. 19, 2021

(54) METHOD FOR JOINING A CERAMIC FRICTION ELEMENT TO A PIEZOCERAMIC ELEMENT

(71) Applicant: PHYSIK INSTRUMENTE (PI) GMBH & CO. KG, Karlsruhe (DE)

(72) Inventors: Wladimir Wischnewskiy, Rathenow (DE); Alexej Wischnewski, Wörth (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 162 days.

(21) Appl. No.: 16/302,278

(22) PCT Filed: May 31, 2017

(86) PCT No.: PCT/DE2017/100467
§ 371 (c)(1),
(2) Date: Nov. 16, 2018

(87) PCT Pub. No.: WO2017/206995
PCT Pub. Date: Dec. 7, 2017

(65) Prior Publication Data
US 2019/0296660 A1    Sep. 26, 2019

(30) Foreign Application Priority Data

Jun. 2, 2016 (DE) .......... 10 2016 110 209

(51) Int. Cl.
*H04R 17/00* (2006.01)
*H02N 2/00* (2006.01)
(Continued)

(52) U.S. Cl.
CPC .............. *H02N 2/007* (2013.01); *C03C 8/24* (2013.01); *C04B 37/003* (2013.01);
(Continued)

(58) Field of Classification Search
CPC .......... H02N 2/007; H02N 2/026; H02N 2/22; H01L 41/257; C03C 8/24; C03C 2209/00;
(Continued)

(56) References Cited

U.S. PATENT DOCUMENTS

| | | | |
|---|---|---|---|
| 6,765,335 B2 | 7/2004 | Wischnewskiy | 310/323.02 |
| 8,344,592 B2 | 1/2013 | Wischnewskly et al. | 310/323.02 |

(Continued)

FOREIGN PATENT DOCUMENTS

| | | | |
|---|---|---|---|
| DE | 102008012992 A1 | 9/2009 | H02N 2/06 |
| JP | H06196770 A | 7/1994 | C04B 37/02 |
| JP | H06232472 A | 8/1994 | C04B 37/02 |

OTHER PUBLICATIONS

The Notification Concerning Transmittal of International Preliminary Report on Patentability (Chapter I of the Patent Cooperation Treaty), in English, dated Dec. 13, 2018, which was issued by the International Bureau of WIPO in Applicant's corresponding international PCT application having Serial No. PCT/DE2017/100467, filed on May 31, 2017.

(Continued)

*Primary Examiner* — Paul D Kim
(74) *Attorney, Agent, or Firm* — Bodner & O'Rourke, LLP; Gerald T. Bodner; Christian P. Bodner

(57) ABSTRACT

The invention relates to a method for joining a ceramic friction element (11) to a piezoelectric element (1), comprising, among other things, the following steps: pressing (14) a joining surface (10) of the friction element and a contact surface (9) of the piezoelectric element against each other with a low-melting glass mass (12) arranged therebetween and maintaining the pressing force for all subsequent steps; heating (17) the piezoelectric element and the friction element to a defined temperature above the Curie point of the piezoceramic material of the piezoelectric element and (Continued)

Figure 1:
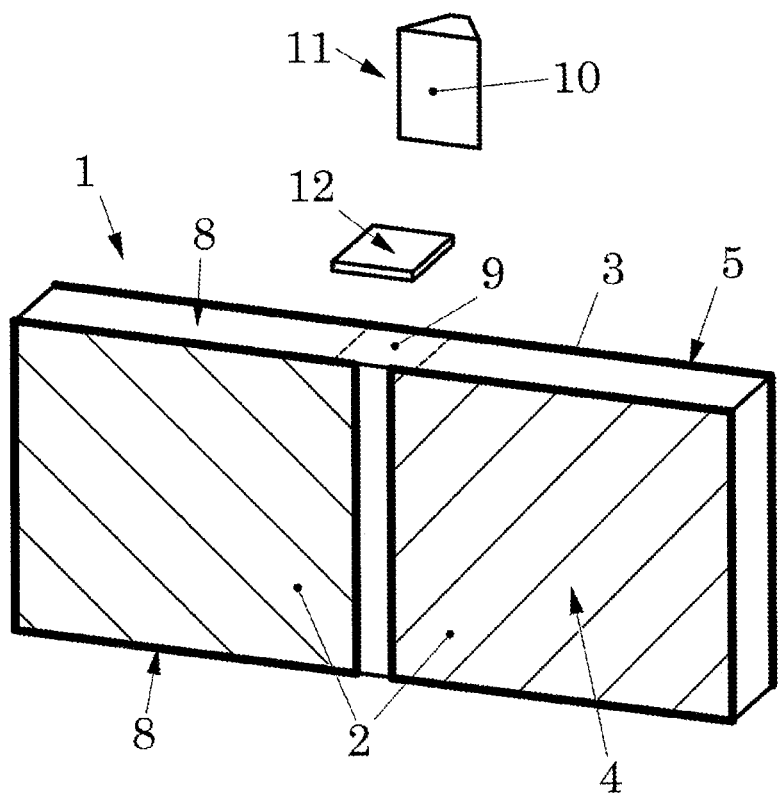

above the melting point of the low-melting glass mass; thereafter, while maintaining the temperature, applying an electric polarization voltage Up to electrodes of the piezoelectric element; removing the polarization voltage after the Curie point has been fallen below; and cooling the piezoelectric element and the friction element to room temperature without an electric voltage being applied to the electrodes.

7 Claims, 3 Drawing Sheets

(51) Int. Cl.
*C03C 8/24* (2006.01)
*C04B 37/00* (2006.01)
*H01L 41/257* (2013.01)
*H02N 2/02* (2006.01)

(52) U.S. Cl.
CPC .......... *C04B 37/005* (2013.01); *H01L 41/257* (2013.01); *H02N 2/026* (2013.01); *H02N 2/22* (2013.01); *C03C 2209/00* (2013.01); *C04B 2237/10* (2013.01); *C04B 2237/343* (2013.01); *C04B 2237/346* (2013.01); *C04B 2237/348* (2013.01); *C04B 2237/365* (2013.01); *C04B 2237/368* (2013.01)

(58) Field of Classification Search
CPC . C04B 37/003; C04B 37/005; C04B 2237/10; C04B 2237/343; C04B 2237/346; C04B 2237/348; C04B 2237/365; C04B 2237/368

See application file for complete search history.

(56) References Cited

U.S. PATENT DOCUMENTS 9,729,086 B2 * 8/2017 Wischnewskiy ....... H02N 2/026
2011/0175489 A1 * 7/2011 Wischnewskij .... H01L 41/0986
310/323.02

OTHER PUBLICATIONS

The English translation of the International Preliminary Report on Patentability (Chapter I of the Patent Cooperation Treaty), dated Dec. 4, 2018, which was issued by the International Bureau of WIPO in Applicant's corresponding international PCT application having Serial No. PCT/DE2017/100467, filed on May 31, 2017.

The Written Opinion of the International Searching Authority, in English, dated Sep. 1, 2017, which was issued by the International Bureau of WIPO in Applicant's corresponding international PCT application having Serial No. PCT/DE2017/100467, filed on May 31, 2017.

The International Search Report, in English, dated Sep. 1, 2017, which was issued by the International Bureau of WIPO in Applicant's corresponding international PCT application having Serial No. PCT/DE2017/100467, filed on May 31, 2017.

* cited by examiner

METHOD FOR JOINING A CERAMIC FRICTION ELEMENT TO A PIEZOCERAMIC ELEMENT

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

(1) Field of the Invention

The invention relates to a method for joining a ceramic friction element to a piezoceramic element, preferably with a piezoelectric actuator, in accordance with claim 1.

(2) Description of Related Art

A piezoelectric ultrasonic motor is known from U.S. Pat. No. 6,765,335 B2, whose ultrasonic actuator consists of a piezoelectric element, which is designed as a plate or cylinder made of piezoceramic material and on or to which one or a plurality of ceramic friction elements made of a ceramic material is/are arranged or connected. The respective ceramic friction element is usually joined to the piezo element in two ways.

In a first type of connection, the friction element is bonded to the piezo element using an organic substance, e.g. epoxy adhesive. The disadvantage of this bonding method is that the maximum temperature the adhesive can withstand permanently is determined by its hardening temperature, which is between 100 and 150° C. This temperature is not sufficient for many industrial applications. In addition, there is a risk of contamination by the organic adhesive when the motor is operated in a high vacuum, which is why ultrasonic motors produced in this way cannot be used in high vacuum applications.

In a second type of connection, the friction element is connected to the piezo element by bonding or by welding with a low-temperature glass. The friction element is joined to the piezo element by means of a high temperature and only then is the entire piezo ceramic polarized at low temperature. The disadvantage of this joining method is that the polarization of the piezo ceramic results in a significant deformation of the piezo element caused by the rotation of the polar domains of the piezo ceramic. This causes considerable mechanical tension in the connection area between the friction element and the piezo element, which negatively influences the strength of the piezo element. For this reason, actuators manufactured in this way cannot be used in powerful ultrasonic motors.

BRIEF SUMMARY OF THE INVENTION

It is therefore the task of the invention to provide a method for joining a ceramic friction element to a piezoceramic element or piezoelectric element, in which only slight mechanical tensions arise in the area of the joint, and in which the elements thus joined can be used at higher temperatures and in high-vacuum applications.

This task is solved by a method according to claim 1, wherein the subsequent sub-claims are functional further developments thereof.

Accordingly, a method for connecting a ceramic friction element to an element of piezoceramic material defining a piezoelectric element is provided, wherein the piezoelectric element comprises at least one excitation electrode and at least one general electrode spaced therefrom, and at least a portion of the piezoceramic material of the piezoelectric element is disposed between the excitation electrode and the general electrode.

The method according to the invention comprises the following process steps:

Step 1: Preparation of a low-melting glass mass;

Step 2: Disposing the low-melting glass mass between a joining surface of the friction element and a contact surface of the piezo element or applying the low-melting glass mass onto a joining surface of the friction element and/or onto a contact surface of the piezo element;

Step 3: Applying a pressing force and pressing the joining surface of the friction element and the contact surface of the piezoelectric element against one another with the low-melting glass mass arranged therebetween and maintaining the pressing force for all subsequent process steps;

Step 4: Heating the piezoelectric element and the friction element to a defined temperature above the Curie point of the piezoceramic material of the piezo element and above the melting point of the low-melting glass mass;

Step 5: After reaching the defined temperature of the piezoelectric element and the friction element and while maintaining the defined temperature, applying an electric polarization voltage Up to the electrodes of the piezoelectric element so that an electric field Ep polarizing the piezoceramic material is generated in the piezoceramic material between the electrodes, and maintaining the electric field Ep for a defined period of time;

Step 6: Cooling the piezoelectric element and the friction element while maintaining the polarizing electric field Ep below the Curie point, and, after falling below the Curie point, removing the electric polarization voltage Up applied to the electrodes;

Step 7: Cooling the piezoelectric element and the friction element to room temperature without an electric voltage being applied to the electrodes.

It may be advantageous that the low-melting glass mass is prepared in the form of a film or a paste consisting of an organic binder and low-melting glass particles. In this respect, it may be advantageous that the low-melting glass mass is applied on the contact surface of the piezoelectric element and/or the joining surface of the friction element by melting with simultaneous combustion of the organic binder.

Furthermore, it may be advantageous that during the preparation of the low-melting glass mass, grains of calibrated size of a refractory oxide ceramic are added thereto.

Furthermore, it may be advantageous that a polarization current is stabilized when the electric voltage is applied to the electrodes of the piezo element.

It can also be advantageous that at least process steps 4 to 6 are carried out in such a way that the piezoelectric element and the friction element are located in a furnace.

In this respect, it may be advantageous if process steps 4 to 6 are carried out under an inert gas atmosphere.

The figures show the following:

BRIEF DESCRIPTION OF THE SEVERAL VIEWS OF THE DRAWINGS(S)

FIG. 1: Piezoelectric element in the form of a rectangular piezoelectric actuator with a friction element to be fitted thereto.

Figure 2:
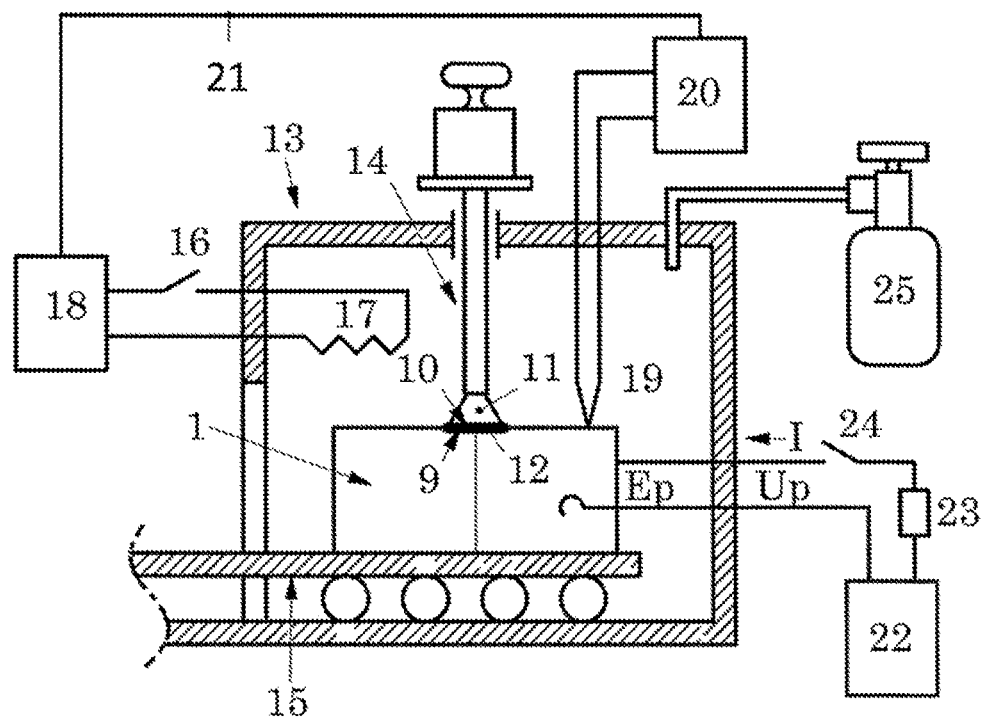

FIG. 2: Schematic structure for implementing the method according to the invention.

Figure 3:
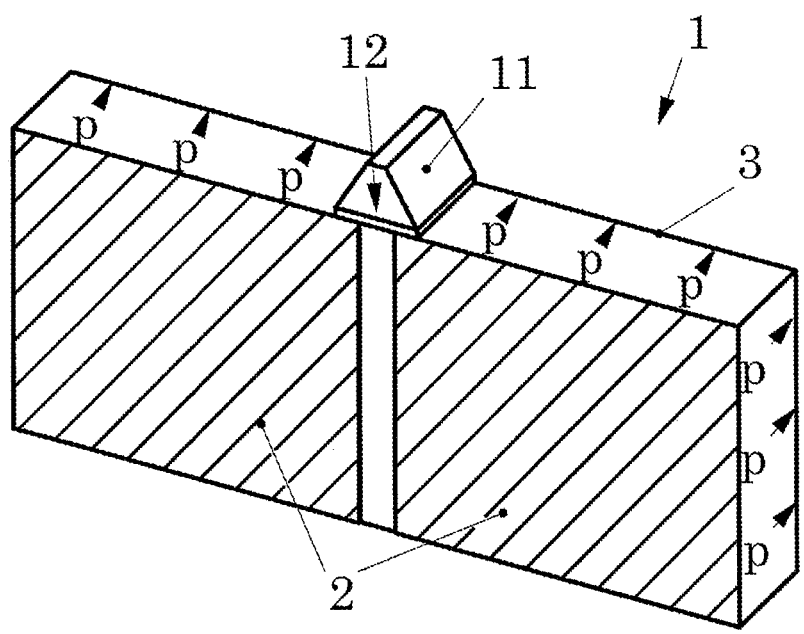

FIG. 3: Piezoelectric element according to FIG. 1 with a friction element joined thereto according to the method of the invention.

DETAILED DESCRIPTION OF THE INVENTION

FIG. 1 shows a piezoelectric element 1 in the form of a rectangular plate made of a piezoceramic material, i. e. hard piezoelectric PZT-based ceramic of the system $PbTiO_3$—$PbZrO_3$ with various additives. Excitation electrodes 2 are arranged on the main surface 4 of the piezo element 1 pointing forward in FIG. 1, and a common electrode 3 is arranged on the main surface 5 pointing backward in FIG. 1, which cannot be seen. The piezoelectric element 1 comprises a total of four side faces 8, wherein the side face 8 pointing upwards in FIG. 1 has a region which defines a contact surface 9, and the contact surface 9 is provided for connection to the joining surface 10 of the friction element 11 via a low-melting glass mass 12.

The temperature of the Curie point for the piezoceramic of the piezo element is in the range between 280 and 350° C. The friction element 11 consists of an oxide ceramic based on $Al_2O_3$. It can also consist of $ZrO_2$, $SiC$, $Si_3N_4$ or other hard abrasion-resistant oxide ceramics. In addition, the friction element can also be made of hard monocrystals such as sapphire, ruby or corundum.

The low melting glass mass 12 consists of low-melting glass particles and a binding material. A low-melting and lead-containing glass system made of $PDO$-$P_2O_5$ is used. Systems made of $Pb(PO_3)_2$—$Zn(BO_2)_2$, $Pb(PO_3)_2$—$V_2O_5$ or $PbO$—$B_2O_3$ with various additives are also possible. Other systems with low-melting glass can also be used, which form a stable compound with the piezoelectric PZT-based ceramic of piezoelectric element 1 and the oxide ceramic of friction element 11. The size of the glass particles can range from 10 to 100 µm and is 50 µm here.

FIG. 2 schematically shows the instrumental structure for implementing the method according to the invention. The piezo element is placed together with the friction element in a furnace 13. Prior to placing the piezo element in the furnace, steps 1 and 2 are carried out, i. e. preparing the low-melting glass mass and disposing the low-melting glass mass between the joining surface 10 of the friction element 11 and the contact surface 9 of the piezoelectric element 1.

In process step 1, the grains of the low-melting glass are mixed with a binder. Grains of calibrated size of a refractory oxide ceramic such as $Al_2O_3$ or $ZrO_2$ are added to the low-melting glass mass. The particle size determines the layer thickness of the low-melting glass mass and can be in the range between 10 and 100 µm. Various organic materials can be used as binding material, such as vaseline, paraffin, polyvinyl alcohol and other materials that burn or evaporate during the heat applied in a subsequent process step. The low-melting glass mass is then processed into a thin film with a thickness between 0.05 and 0.2 µm or into a paste.

In process step 2, the low-melting glass mass in the form of a film is placed between the friction element 11 and the piezoelectric element 1, or the low-melting glass mass in the form of a paste is applied to the joining surface 10 of the friction element 11 and/or to the contact surface 9 of the piezoelectric element 1. It is also possible to melt the low-melting glass mass onto the joining surface 10 of the friction element 11 and/or onto the contact surface 9 of the piezoelectric element 1.

Subsequently, with process step 3, a pressing force is applied, which causes the joining surface 10 of the friction element 11 and the contact surface 9 of the piezoelectric element 1 to be pressed against each other with the low-melting glass mass 12 arranged therebetween and the pressing force is maintained for all subsequent process steps. In the specific example, the members piezoelectric element 1 and friction element 11 prepared according to process steps 1 and 2 are placed in the interior of the furnace 13 prior to pressing against each other by means of a linear guide device 15, wherein the application of a force for pressing the joining surface 10 of the friction element 11 and the contact surface 9 of the piezo element 1 against each other is realized by a stamp 14 projecting from the outside into the furnace interior, which pushes the friction element 11 in the direction of the piezoelectric element 1 and which is loaded with a weight outside the furnace. The pressure or pressing force thus exerted on the friction element 11, by which the joining surface 10 of the friction element 11 is pressed against the contact surface 9 of the piezoelectric element 1, with the simultaneous existence of the low-melting glass mass 12 therebetween, is maintained for all subsequent process steps.

In process step 4, the heating of the piezo element 1 and the friction element 11 in the furnace 13 is carried out by means of the heater 17 by closing the switch 16 to a defined temperature which is above the Curie point of the piezoceramic material of the piezoelectric element 1 and above a melting point of the low-melting glass mass 12. This defined temperature is between 400 and 500° C.

The heating temperature is monitored by means of a temperature sensor 19 and a control unit 20. The control unit 20 for the temperature sensor 19 can be connected to the device 18 for automatic temperature control of the heater 17 via the electrical connection 21.

Either already prior to the implementation of process step 4, or simultaneously with the implementation of process step 4, or also after the implementation of process step 4, by means of process step 5, the electric polarization voltage Up provided by the electric voltage supply 22 is applied to the electrodes 2 and 3 of the piezoelectric element via the resistor 23 and the switch 24. The voltage level is selected in such a way that a polarization field Ep is created with a field strength between 500 and 1000V/mm. The field strength of the polarization field Ep depends on the type of piezoceramic to be polarized. When the melting temperature of the low-melting glass mass is reached, a corresponding melting process begins and diffusion of the glass molecules starts via the contact surface 9 into the area of piezo element 1 adjacent to the contact surface and via the joining surface 10 into the area of the friction element 11 adjacent to the joining surface 10. At the same time, the organic binder components of the low-melting glass mass are completely burnt or evaporated, leaving only the low-melting glass material.

The high heating temperature, which also affects the piezo element, has the positive side effect that the domains of the piezo ceramic are strongly vibrated, so that they can be easily aligned in one direction by a comparatively low electric field Ep. In other words, under the influence of temperature, it is possible to polarize the piezo ceramic more easily or faster.

During the process of aligning the domains in the piezo ceramic, the piezo ceramic is slightly deformed. However, since the low-melting glass mass is in the molten state during this process, this does not lead to mechanical tensions on the surface or within piezo element 1 and friction element 11.

Following a polarization holding time of between 5 and 20 minutes, the heating temperature is lowered in process step 6 to a temperature below the Curie point of the piezoelectric ceramic of the piezoelectric element 1. The domains of the piezoceramics are fixed in the now essentially unidirectional position and the polarization process is terminated. Now the polarization field Ep or the polarization voltage Up can be removed and the temperature either inside or outside the furnace can be lowered to room temperature without an electrical voltage being applied to the electrodes of the piezo element. This causes the low-melting glass to solidify completely.

It is possible to stabilize the polarization current Ip during the phases of heating and cooling of the piezoelectric element 1 in the corresponding process steps. This can be achieved by means of a limiting resistor 23.

If the electrodes 2, 3 of the piezoelectric element 1 consist of silver (Ag), the joining process described above can be carried out under an air atmosphere. However, if the electrodes 2, 3 of the piezoelectric element 1 consist of the system chromium (Cr)-copper (Cu)-nickel (Ni) (gold (Au)) or if these have been produced by chemical deposition of nickel (Ni), it is advantageous if the process steps 4 to 6 are carried out under an inert gas atmosphere, e.g. under an argon atmosphere, wherein the corresponding inert gas from a pressure vessel 25 can be fed into the interior of the furnace 13. This reduces or prevents oxidation of the electrodes at the high heating temperature of piezo element 1.

What is claimed is:

1. A method of joining a ceramic friction element (11) to an element of piezoceramic material defining a piezoelectric element (1), said piezoelectric element (1) comprising at least one excitation electrode (2) and at least one general electrode (3) spaced from the at least one excitation electrode (2), and between said excitation electrode (2) and said general electrode (3) at least a portion of the piezoceramic material of said piezoelectric element (1) is disposed, said method comprising the following process steps:
   Step 1: Preparation of a low-melting glass mass (12);
   Step 2: Disposing the low-melting glass mass (12) between a joining surface (10) of the friction element (11) and a contact surface (9) of the piezo element (1);
   Step 3: Applying a pressing force and pressing the joining surface (10) of the friction element (11) and the contact surface (9) of the piezoelectric element (1) against one another with the low-melting glass mass (12) arranged therebetween and maintaining the pressing force for all subsequent process steps;
   Step 4: Heating the piezoelectric element (1) and the friction element (11) to a defined temperature above the Curie point of the piezoceramic material of the piezo element (1) and above the melting point of the low-melting glass mass (12);
   Step 5: After reaching the defined temperature of the piezoelectric element (1) and the friction element (11) and while maintaining the defined temperature, applying an electric polarization voltage Up to the electrodes (2, 3) of the piezoelectric element (1) so that an electric field Ep polarizing the piezoceramic material is generated in the piezoceramic material between the electrodes (2, 3), and maintaining the electric field Ep for a defined period of time;
   Step 6: Cooling the piezoelectric element (1) and the friction element (11) while maintaining the polarizing electric field Ep below the Curie point, and, after falling below the Curie point, removing the electric polarization voltage Up applied to the electrodes (2, 3);
   Step 7: Cooling the piezoelectric element and the friction element to room temperature without any electric voltage being applied to the electrodes (2,3).

2. The method according to claim 1, characterized in that the low-melting glass mass (12) is prepared in the form of a film or a paste consisting of an organic binder and low-melting glass particles.

3. The method according to claim 2, characterized in that the low-melting glass mass (12) is applied to the contact surface (9) of the piezoelectric element (1) and/or the joining surface (10) of the friction element (11) by melting with simultaneous combustion of the organic binder.

4. The method according to claim 1, characterized in that during the preparation of the low-melting glass mass (12), grains of calibrated size of a refractory oxide ceramic are added to the low-melting glass mass (12).

5. The method according to claim 1, characterized in that a polarization current Ip is stabilized when the electric polarization voltage Up is applied to the electrodes (2, 3) of the piezoelectric element (1).

6. The method according to claim 1, characterized in that at least process steps 4 to 6 are carried out such that the piezoelectric element (1) and the friction element (11) are located in a furnace (13).

7. The method according to claim 6, characterized in that the process steps 4 to 6 are carried out under an inert gas atmosphere.

* * * * *